United States Patent
Khoshgard et al.

(10) Patent No.: US 10,298,249 B1
(45) Date of Patent: May 21, 2019

(54) TIME ERROR AND GAIN OFFSET ESTIMATION IN INTERLEAVED ANALOG-TO-DIGITAL CONVERTERS

(71) Applicant: SiTune Corporation, San Jose, CA (US)

(72) Inventors: Mahdi Khoshgard, Los Gatos, CA (US); Marzieh Veyseh, Los Altos, CA (US); Vahid M Toosi, Los Altos, CA (US)

(73) Assignee: SiTune Corporation, San Jose, CA (US)

(*) Notice: Subject to any disclaimer, the term of this patent is extended or adjusted under 35 U.S.C. 154(b) by 0 days.

(21) Appl. No.: 16/044,492

(22) Filed: Jul. 24, 2018

(51) Int. Cl.
  *H03M 1/06* (2006.01)
  *H03M 1/10* (2006.01)
  *H03M 1/12* (2006.01)

(52) U.S. Cl.
  CPC ....... *H03M 1/1028* (2013.01); *H03M 1/0624* (2013.01); *H03M 1/1019* (2013.01); *H03M 1/1215* (2013.01); *H03M 1/06* (2013.01)

(58) Field of Classification Search
  CPC ............. H03M 1/06; H03M 1/10; H03M 1/12
  USPC ............................ 341/118, 120, 166, 12, 155
  See application file for complete search history.

(56) References Cited

U.S. PATENT DOCUMENTS

2016/0049949 A1* 2/2016 Waltari ............... H03M 1/0626
                                                                341/120

* cited by examiner

*Primary Examiner* — Joseph J Lauture
(74) *Attorney, Agent, or Firm* — Platinum Intellectual Property LLP

(57) ABSTRACT

Approaches provide for calibrating high speed analog-to-digital converters (ADCs). For example, a calibration signal can be applied to parallel ADCs. The output of the parallel ADCs can be analyzed using a set of filtering components configured to at least filter image components and cause a phase shift in the output signals. One or more delay adjustment components can cause a delay to at least the output of the parallel ADCs and the set of filtering components. A cross-correlating component can be utilized to cross-correlate the output of the parallel ADCs with an output signal of at least one filtering component of the set of filtering components and an output signal of at least one delay adjustment component of the set of delay adjustment components. A conversion component determines polar coordinates from rectangular coordinates from the output of the cross-correlating component. Thereafter, a time-offset and gain estimator component can determine one of gain error calibration data or time-offset calibration data based at least in part on an output signal of the conversion component, which can be stored and/or used to calibrate individual time-interleaved ADCs.

20 Claims, 7 Drawing Sheets

TIME ERROR AND GAIN OFFSET ESTIMATION IN INTERLEAVED ANALOG-TO-DIGITAL CONVERTERS

BACKGROUND

With high bandwidth applications (e.g., full band cable and satellite receivers, serial links and short-range wireless communications) becoming more and more popular, there is increasing demand for high speed and high-performance analog-to-digital convertors (ADCs). An effective way to improve the throughput of an ADC is to place several ADCs that operate at a fraction of the total sample rate of the ADC in a time-interleaved architecture. However, it is a challenge to control and compensate mismatch (e.g., offset, gain, and timing) of the channel ADCs with the time-interleaved architecture.

DETAILED DESCRIPTION

Figure 1:
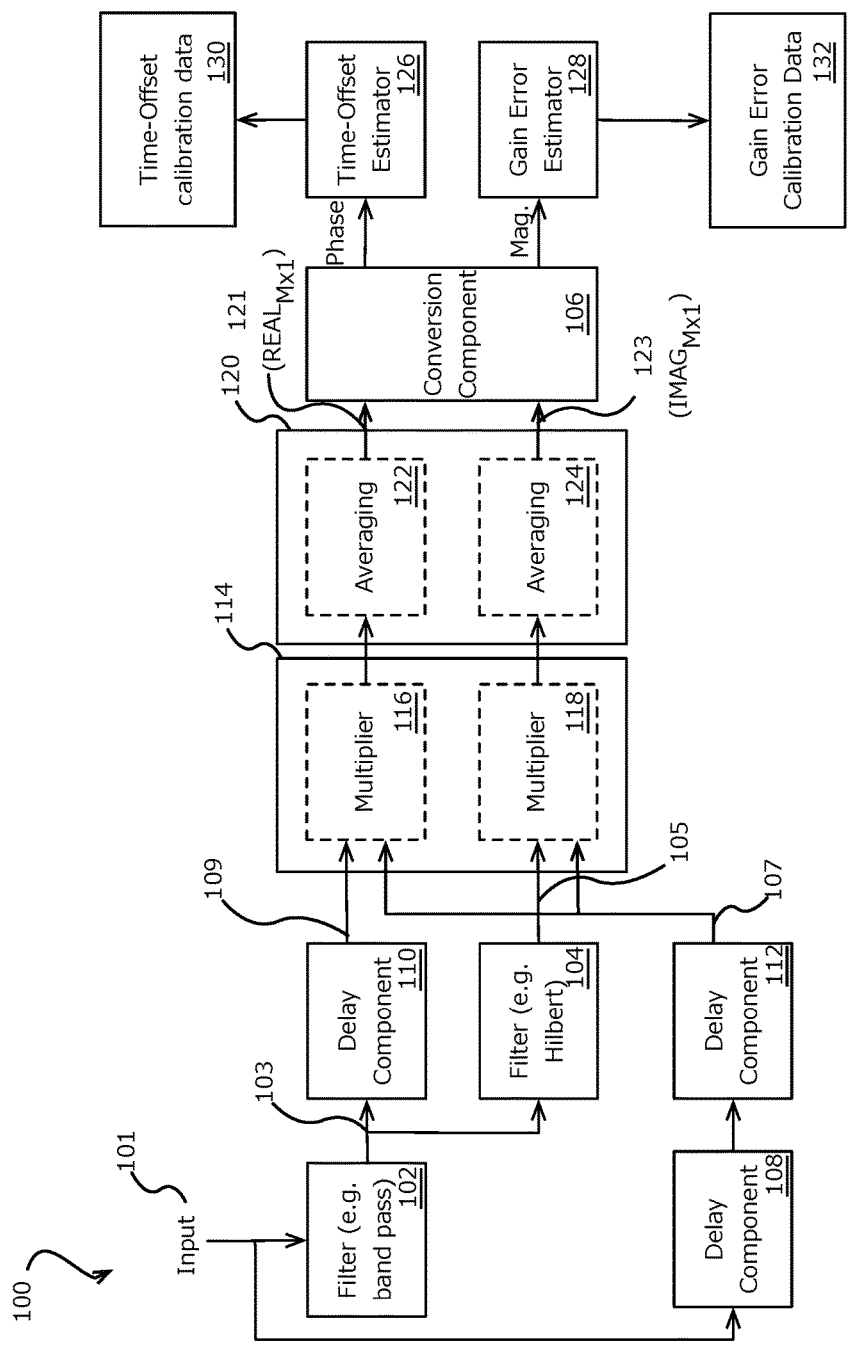
FIG. 1 illustrates a block diagram of a system to determine gain error calibration data and time-offset calibration data in accordance with various embodiments.

Systems and methods in accordance with various embodiments of the present disclosure may overcome one or more of the aforementioned and other deficiencies experienced in conventional approaches to calibrating a high-speed analog-to-digital converter (ADC). In particular, various embodiments describe systems and methods for determining calibration data or other such optimization data for one or more ADCs (e.g., a set of time-interleaved ADCs) and updating an output digital signal from the ADC(s) using the calibration data to generate an output signal that is calibrated for gain mismatches and timing errors in and between individual ADCs of the set of time-interleaved ADCs.

For example, a calibration signal (e.g., a DC signal) can be applied to parallel ADCs. The output of the parallel ADCs can be analyzed using a set of filtering components configured to at least filter image components from the output and cause a phase shift in the output. One or more delay adjustment components can cause a delay to at least the output of the parallel ADCs and the set of filtering components. A cross-correlating component can be utilized to cross-correlate the output of the parallel ADCs with an output signal of at least one filtering component of the set of filtering components and an output signal of at least one delay adjustment component of the set of delay adjustment components. A conversion component can determine polar coordinates from rectangular coordinates from the output of the cross-correlating component. Thereafter, a time-offset and gain estimator component can determine one of gain error calibration data or time-offset calibration data based at least in part on an output signal of the conversion component, which can be stored and/or used to calibrate individual time-interleaved ADCs.

In an implementation, the present disclosure is to a system including a signal generator, a switch, parallel analog-to-digital converters (ADCs), a gain correction component, a time-offset correction component, a time-offset and gain estimator, a set of filtering components, a set of delay adjustment components, a set of delay adjustment components, and a conversion component. The signal generator can be configured to provide a signal during a calibration mode. The parallel ADCs can provide ADC outputs (e.g., digital outputs) that includes at least one image component. The set of filtering components can at least filter the image component and cause a phase shift in the signal. The set of delay adjustment components can delay at least the signal a predetermined amount of time. The cross-correlating component can cross-correlate the signal with an output signal of at least one filtering component of the set of filtering components and an output signal of at least one delay adjustment component of the set of delay adjustment components. The conversion component can determine polar coordinates from rectangular coordinates. The time-offset estimator and the gain estimator component can analyze the polar coordinates to determine gain error calibration data and time-offset calibration data, which can be stored in the memory and/or otherwise applied to the ADCs. Thereafter, the system incorporating these components and performing these features is, accordingly, calibrated.

Various other functions and advantages are described and suggested below as may be provided in accordance with the various embodiments.

FIG. 1 illustrates a block diagram of a system 100 to determine gain error calibration data to compensate for gain mismatch in and between individual parallel time-interleaved ADCs and time-offset calibration data to compensate for timing errors in and between individual parallel time-interleaved ADCs in accordance with various embodiments.

As described, there can be at least two types of mismatches in a set of time-interleaved ADCs. A first type of mismatch can include a mismatch between gain coefficients of the set of time-interleaved ADCs, where the gain mismatches can be deviations of the gains from the average gain of individual ADC channels. A second type of mismatch can include sampling errors of ADC channels of the set of time-interleaved ADCs. The sampling errors can be from timing mismatches between the set of time-interleaved ADCs channels and can be the deviations from linear-phase responses of the set of time-interleaved ADCs channels normalized by the frequency.

As shown in FIG. 1, system 100 includes filter components 102 and 104; rectangular to polar conversion component 106; delay adjustment components 108, 110, and 112; multiplier module 114 that includes multiplier components 116 and 118; averaging module 120 that includes averaging components 122 and 124; time-offset estimator component 126 configured to determine time-offset calibration data 130 and gain estimator component 128 configured to determine gain error calibration data 132. The system may include additional components in accordance with various embodiments described herein.

Input signal 101 can be received at filter component 102. Input signal 101 can be the output of a gain correction component after a set of time-interleaved ADCs. For example, an analog calibration tone can be received at inputs of the set of time-interleaved ADCs. The set of time-interleaved ADCs can convert the analog calibration tone to a digital signal, where the digital signal is fed or otherwise provided to a gain correction component (and in various embodiments a gain correction component and a time-offset correction component) and the output of the gain correction component (or combination of components (e.g., a gain correction component and a time-offset correction component) is input signal 101. In accordance with various embodiments, initial values of gain error calibration data and/or time offset calibration data can be zero or another predetermined value. Input signal 101 can be associated with one or more characteristics, such as a signal of known frequency, a signal with a known frequency and an unknown amplitude, a signal with a known frequency and an unknown phase, or combination thereof. In an example, the frequency can be associated with a predetermined, for example, fundamental frequency. As will be described further herein, signal 101 can include one or more images.

Filter component 102 can filter the one or more images from input signal 101 to generate signal 103. Signal 103 does not include the images or at least includes a reduced number of images. In accordance with various embodiments, filter component 102 can be a band-pass filter operable to allow signals between two specific frequencies to pass and discriminate against signals at other frequencies.

Signal 103 can be received at filter component 104 to generate signal 105. Signal 105 is a—90-degree phase shift of signal 103 and includes data points that include sinusoidal waves. Filter component 104 can include a Hilbert filter operable to perform a Hilbert transform. It should be noted that one or more other filters that allow for a—90-degree phase shift of signal 103 can be used in accordance with the embodiments described herein. In various embodiments, a Hilbert filter is an example of a phase adjusted filters. As one skilled in the art will recognize, taking a transform of a real signal results in a set of complex coefficients. Complex coefficients can components. In this example, the components can include a magnitude component and a phase angle component. The magnitude component can represent the distribution of signal energy through frequency. The phase angle can represent the distribution of a signal's energy through time. The Hilbert transform can manipulate the Fourier phase to change the structure of a signal without affecting the signals amplitude spectrum. For example, the Hilbert transform can produce a phase shift in a signal.

In accordance with various embodiments, filter component 102 and filter component 104 can be paired with delay adjustment components (e.g., delay adjustment components 108, 110, and 112) that allow for the same length as the filters (e.g., filter components 102 and 104) group delay. A group delay, for example, can be the time delay of the amplitude envelopes of the various sinusoidal components of a signal through a component (e.g., filter component 102), and is a function of frequency for that component. In this example, system 100 can include delay adjustment components 110 and 112. A delay adjustment component can provide a delay that substantially matches a group delay of a specific component or a combination of components. For example, delay adjustment component 110 can allow for the same length as filter component's 104 group delay. The output signal 109 of delay adjustment component 110 includes data points that include cos waves. Delay adjustment component 108 can allow for the same length as filter component's 102 group delay. Delay adjustment component 112 can allow for the same length as filter component's 104 group delay. The output signal 107 of delay adjustment component 112 includes data points that substantially match input signal 102. It should be noted that a delay adjustment component can include one or more of a number of filters to delay a signal a length of time that substantially matches a group delay of one or more component individually or in combination.

Signal 109 from delay adjustment component 110, signal 105 from filter component 104, and signal 107 from delay adjustment component 107 can be received at multiplier module 114. Multiplier module can include multiplier component 116 and multiplier component 118. Multiplier component 116 receives signal 109 from delay adjustment component 110 and signal 107 from delay adjustment component 112. Multiplier component 118 receives signal 105 from filter component 104 and signal 107 from delay adjustment component 112. Multiplier component 114 is configured to cross correlate signal 107 (e.g., the input signal 101) with the sin of the input signal (e.g., signal 105) and the cos of the input signal (e.g., signal 109).

The output of multiplier components 116 and 118 is received at averaging module 120.

Averaging module 120 includes averaging component 122 and 124. Averaging components 112 and 124 are configured to generate an average of input signals. As described, input signal 101 includes M signals from a set of time-interleaved ADCs. The output of averaging component 122 is signal 121 and the output of averaging component 124 is signal 123. Signal 121 can include an average of the real coefficients of M signals from the set of time-interleaved ADCs and signal 123 can include an average of the imaginary coefficients of M signals from the set of time-interleaved ADCs.

Signal 121 and signal 123 can be received at rectangular to polar conversion component 106 which can include a rectangular to polar converter, for example. In accordance with various embodiments, a rectangular to polar converter is operable convert rectangular coordinates to polar coordinates. For example, in rectangular form, the signal can be expressed as a vector in terms of its rectangular coordinates, with the horizontal axis being its real axis and the vertical axis being its imaginary axis or j-component. In polar form, the real and imaginary axes can be represented by re$\varphi$. In this example, the average of the real coefficients of the M signals and the average of the imaginary coefficients can be expressed as the magnitude and phase components of the M signals.

The phase of the output of rectangular to polar conversion component 106 can be received at time-offset estimator component 126. Time-offset estimator component 126 can generate time-offset calibration data 130. For example, time-offset estimator component 126 can calculate time-offset calibration data, $\delta_m$, by calculating $$\delta_m = \left(\frac{2\pi F_c}{F_s}\right)^{-1} \times \varphi_m,$$

where $F_c$ is a corner frequency and $F_s$ is a sampling frequency. The magnitude of the output of rectangular to polar conversion component 106 can be received at gain error estimator component 128. Gain error estimator component 128 can generate gain error calibration data 132. For example, time-offset estimator component 128 can calculate gain error calibration data, $\alpha_m$, by calculating $$\alpha_m = \frac{r_m}{\frac{1}{M}\Sigma r_m},$$

where $\alpha_m$ is normalized to the average. Time-Offset calibration data 130 and gain error calibration data 132 can be used to update output digital signals from a set of time-interleaved ADCs, where the updated digital output signal is calibrated for gain mismatches and timing errors in and between individual ADCs of the set of time-interleaved ADCs.

Figure 2:
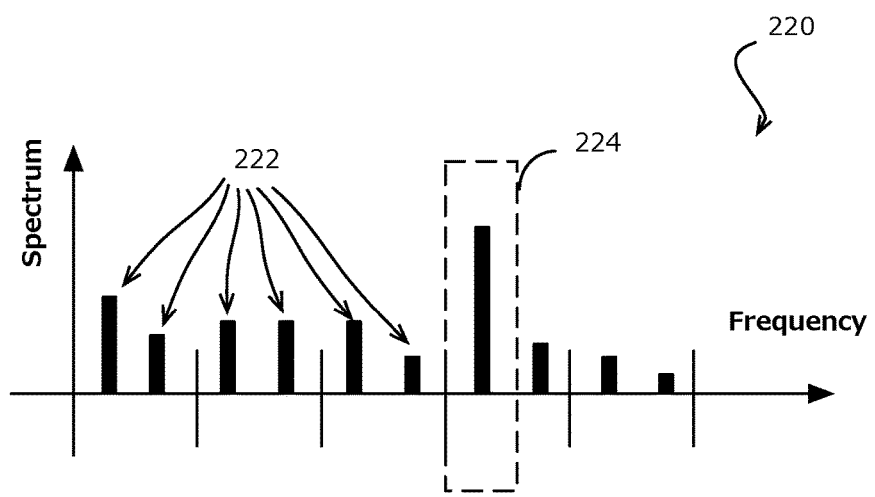
FIG. 2 illustrates an example image spectrum of an output of a set of time-interleaved ADCs in accordance with various embodiments.

FIG. 2 illustrates an example image spectrum 220 of a set of time-interleaved ADCs' output in accordance with various embodiments. As shown in FIG. 2, the spectrum includes main component 224 and individual image components 222. In this example, a frequency of a calibration tone generated during a calibration mode is known. In this situation, because the frequency of the calibration tone is known, a location of main component 224 of image spectrum 220 is known, as well as locations of individual image components 222 caused by gain error and time-offset errors of set of time-interleaved ADCs. For example, assuming a set of time-interleaved ADCs sample an input signal with a frequency of $F_s$, each ADC channel can sample an input signal at a rate of $F_s/M$ causing the input spectrum in a frequency domain to be repeated periodically at intervals of $F_s/M$. If the M ADC channels are perfectly matched, the periodic repetition cancel each other, except at integer multiple of $F_s$. However, channel mismatches between the M ADC channels are inherent in a circuit. The downscaling of an integrated circuit even complicates the matching of components in the M ADC channels. The error behavior of mismatches among the M ADC channels can distort the output signal of a time-interleaved ADC and reduce the system performance significantly.

In accordance with various embodiments, a relationship between individual image components 222 (also referred to as individual image phasors) in image spectrum 220 and the value of time-offset error and gain errors can be represented as:

$$I_K = \frac{1}{M}\sum_{m=0}^{M-1}(\alpha_m \cdot e^{-j2\pi q \delta_m}) \cdot (e^{-j2\pi \frac{m}{M}K}), \qquad \text{Eq (1)}$$

$$K = 0, 1, \ldots, M-1$$

where $I_K$ is the Kth image phasor of the signal for K=1 to M, $I_0$ is the main component of the signal, and q is the frequency of the calibration signal divided by ADC sampling rate. Eq (1) can be represented as M-point FFT as:

$$I_K = \text{FFT}\{\alpha_m \cdot e^{-j2\pi q \delta_m}\} \qquad \text{Eq (2)}$$

The mismatch phasor, $\alpha_m \cdot e^{-j2\pi q \delta_m}$, which represents the gain error and phase error can be extracted directly from the image phasor and can be represented as:

$$\alpha_m \cdot e^{-j2\pi q \delta_m} = \text{IFFT}\{I_K\} \qquad \text{Eq (3)}$$

As described, time-offset calibration data, $\hat{\delta}_{M \times 1}[n]$, and gain error calibration data, $\hat{\alpha}_{M \times 1}[n]$, can be used to update output digital signals from a set of time-interleaved ADCs, where the updated digital output signal is calibrated for gain mismatches and timing errors in and between individual ADCs of the set of time-interleaved ADCs.

Figure 3:
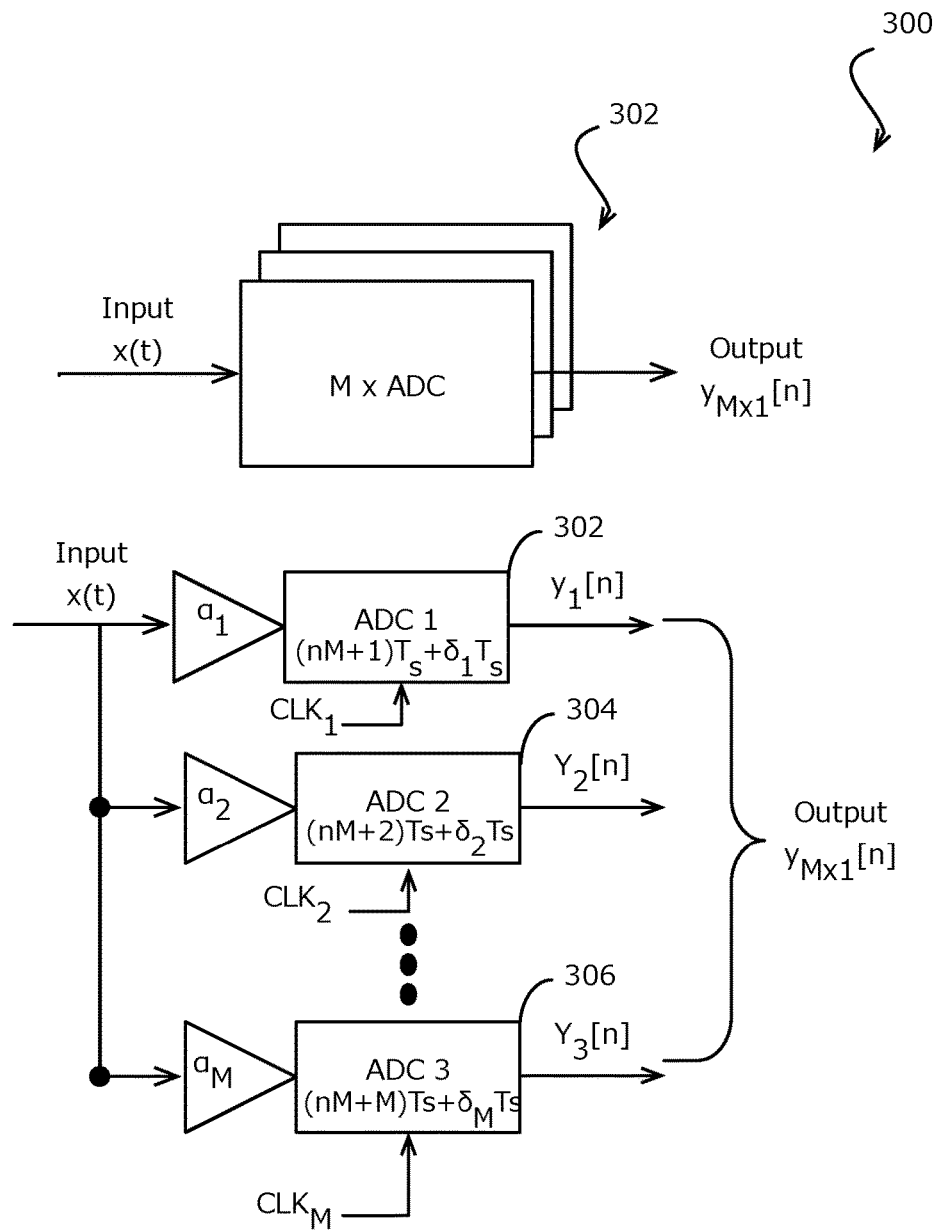
FIG. 3 illustrates a block diagram of a set of time-interleaved ADCs that can be utilized in accordance with various embodiments.

FIG. 3 illustrates a block diagram 300 of a set of time-interleaved ADCs that can be utilized in accordance with various embodiments. As shown in FIG. 3, a set of time-interleaved ADCs 302 can include time-interleaved high-speed ADCs 302, 304, and 306. In this example, ADCs 302 may consist of M parallel ADCs with the same input signal but different sampling clock sources. These different clock sources have the same sampling clock frequency but different sampling clocks phases, for example. In a further example, when M is the number of parallel ADCs and assuming $T_S$ as sampling clock of each ADC, then sampling times are:

$$\text{ADC\#1:CLK}_1 = (nM+1)T_S + \delta_1 T_S \qquad \text{Eq (7)}$$

$$\text{ADC\#2:CLK}_2 = (nM+1)T_S + \delta_2 T_S \qquad \text{Eq (8)}$$

$$\text{ADC\#2:CLK}_2 = (nM+1)T_S + \delta_3 T_S \qquad \text{Eq (9)}$$

Each of ADCs, marked in FIG. 3 as ADC #1, ADC #2, . . . ADC #M, receive the X(t) ADC input (e.g., input signal 101) as well as clocks CLK1, CLK2, . . . CLKM. FIG. 3 also illustrates that the function in the ADCs are=(nM+1) $T_S + \delta_1$ $T_S$, $(nM+1)T_S + \delta_2$ $T_S$ . . . $(nM+1)T_S + \delta_3$ $T_S$. The sampled signal provided at output $y_{M \times 1}[n]$ can be represented as:

$$YM \times 1[n] \triangleq \begin{pmatrix} y1[n] \\ y2[n] \\ y3[n] \\ \vdots \\ yM[n] \end{pmatrix} \triangleq \begin{pmatrix} \alpha 1 \cdot x((nM+1+\delta 1) \cdot Ts) \\ \alpha 2 \cdot x((nM+1+\delta 2) \cdot Ts) \\ \alpha 3 \cdot x((nM+1+\delta 3) \cdot Ts) \\ \vdots \\ \alpha M \cdot x((nM+1+\delta M) \cdot Ts) \end{pmatrix} \qquad \text{Eq (10)}$$

As described, the set of time-interleaved ADCs 302 convert X(t) (e.g., input signal 101) to a digital signal, $y_{M \times 1}[n]$. Time-Offset calibration data, $\hat{\delta}_{M \times 1}[n]$, and gain error calibration data, $\hat{\alpha}_{M \times 1}[n]$, is determined and can be used to update output digital signals from the set of time-interleaved ADCs 302, where the updated digital output signal is calibrated for gain mismatches and timing errors in and between individual ADCs of the set of time-interleaved ADCs.

Figure 4:
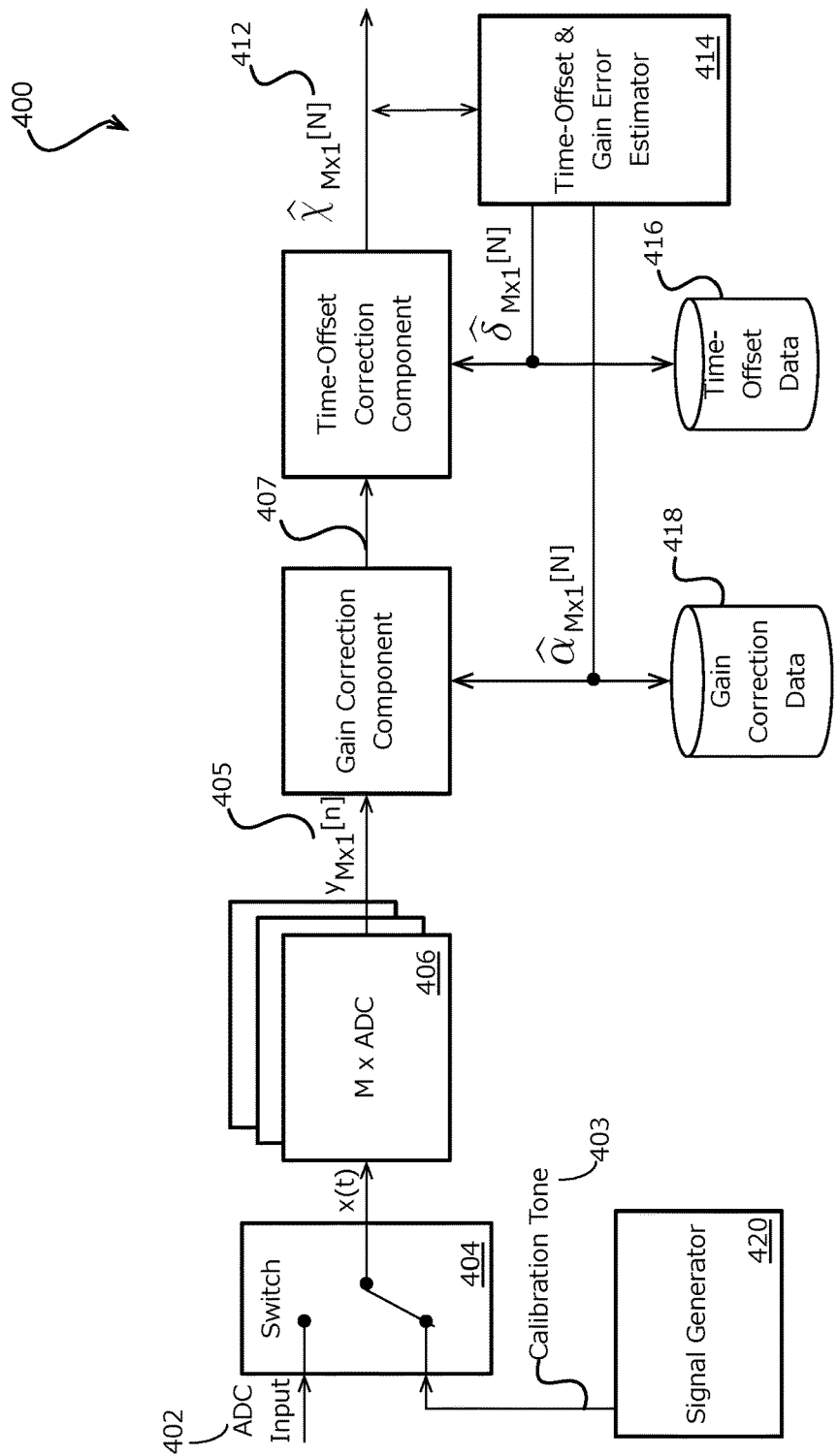
FIG. 4 illustrates a block diagram of a system to determine gain error calibration data and time-offset calibration data in accordance with various embodiments.

FIG. 4 illustrates a block diagram of system 400 to calibrate analog-to-digital converters (ADCs) in accordance with various embodiments. As described, there can be at least two types of mismatches in a set of time-interleaved ADCs. A first type of mismatch can include a mismatch between gain coefficients of the set of time-interleaved ADCs, where the gain mismatches can be deviations of the gains from the average gain of individual ADC channels. A second type of mismatch can include sampling errors of ADC channels of the set of time-interleaved ADCs. The sampling errors can be from timing mismatches between the set of time-interleaved ADCs channels and can be the deviations from linear-phase responses of the set of time-interleaved ADCs channels normalized by the frequency.

As shown in FIG. 4, system 400 includes signal generator 420, switch 404, M parallel ADCs 406, gain correction component 408, time-offset correction component 410, and time-offset and gain estimator 414. System 400 may include additional components in accordance with various embodiments described herein.

Switch 404 can operate in at least two positions. When switch 404 is in a first position, ADC input signal 402 is provided to ADCs 406. The switch can be in a first position during a normal operating mode and in a second position during a calibration mode. It should be understood that references to first and second position are merely for reference. A normal operating mode can include a mode where the system does not receive a calibration signal from signal generator 420. When the switch is in the second position, such as during the calibration mode, switch 404 isolates ADC input signal 402 and obtains calibration tone 403 from a tone source such as tone generator 420.

In accordance with various embodiments, calibration tone 403 is also referred to as a calibration signal, a signal, or a tone. Switch 404 is illustrated for exemplary purposes as a single pole double throw switch, but it should be understood to a person of ordinary skill that other configurations of physical switches or semiconductor switches (e.g., transistors) are also applicable herein. In this example, calibration tone 403 from signal generator 420 is associated with one or more characteristics, such as a signal of known frequency, a signal with a known frequency and an unknown amplitude, a signal with a known frequency and an unknown phase, or combination thereof. In an example, the frequency can be associated with a determined, for example, predetermined, fundamental frequency.

Calibration tone 403 can be received at ADCs 406. The ADCs 406 convert the received analog calibration tone 103 (e.g., x(t)), to a digital signal, $y_{M \times 1}[n]$ 405. In accordance with various embodiments, the set of ADCs can be associated with an initial pre-determined value of gain error and an initial pre-determined value of time-offset. The ADCs may also include one or more memory devices for storing instructions and data. As would be apparent to one of ordinary skill in the art, the one or more memory devices can include many types of memory, data storage, or computer-readable media, such as a data storage for program instructions for execution by the at least one processor and/or being used for storing data, a removable memory available for sharing information with other devices, and any number of computing approaches available for sharing with other processors. An example ADC may also include power components, such as conventional plug-in approaches, a battery operable to be recharged through conventional plug-in approaches, or through other approaches such as wireless (e.g., capacitive or inductive) charging through proximity with a power mat or other such device. Various other elements and/or combinations are possible as well within the scope of various embodiments.

Time-offset and gain estimator 414 is operable to determine time-offset calibration data (e.g., $\hat{\delta}_{M \times 1}[n]$, and optimized gain error calibration data (e.g., $\hat{\alpha}_{M \times 1}[n]$). For example, during the calibration mode, switch 404 is in the second position. In this example, calibration tone 403 from signal generator 420 is received at the set of time-interleaved ADCs 406. The set of time-interleaved ADCs 406 convert calibration tone 403 to a digital signal, $y_{M \times 1}[n]$ 405. Digital signal 405 is fed or otherwise provided to a gain correction component and the output of the gain correction component is signal 407 (e.g., input signal 101). In accordance with various embodiments, the initial gain and correction value can be zero or another predetermined value. Time-offset and gain estimator 414 can process signal 405 as described with respect to FIG. 1 to generate time-offset calibration data (e.g., $\hat{\delta}_{M \times 1}[n]$), and optimized gain error calibration data (e.g., $\hat{\alpha}_{M \times 1}[n]$). Thereafter, the time-offset calibration data can be stored in data store 416 and the gain error calibration data can be stored in data store 418.

Figure 5:
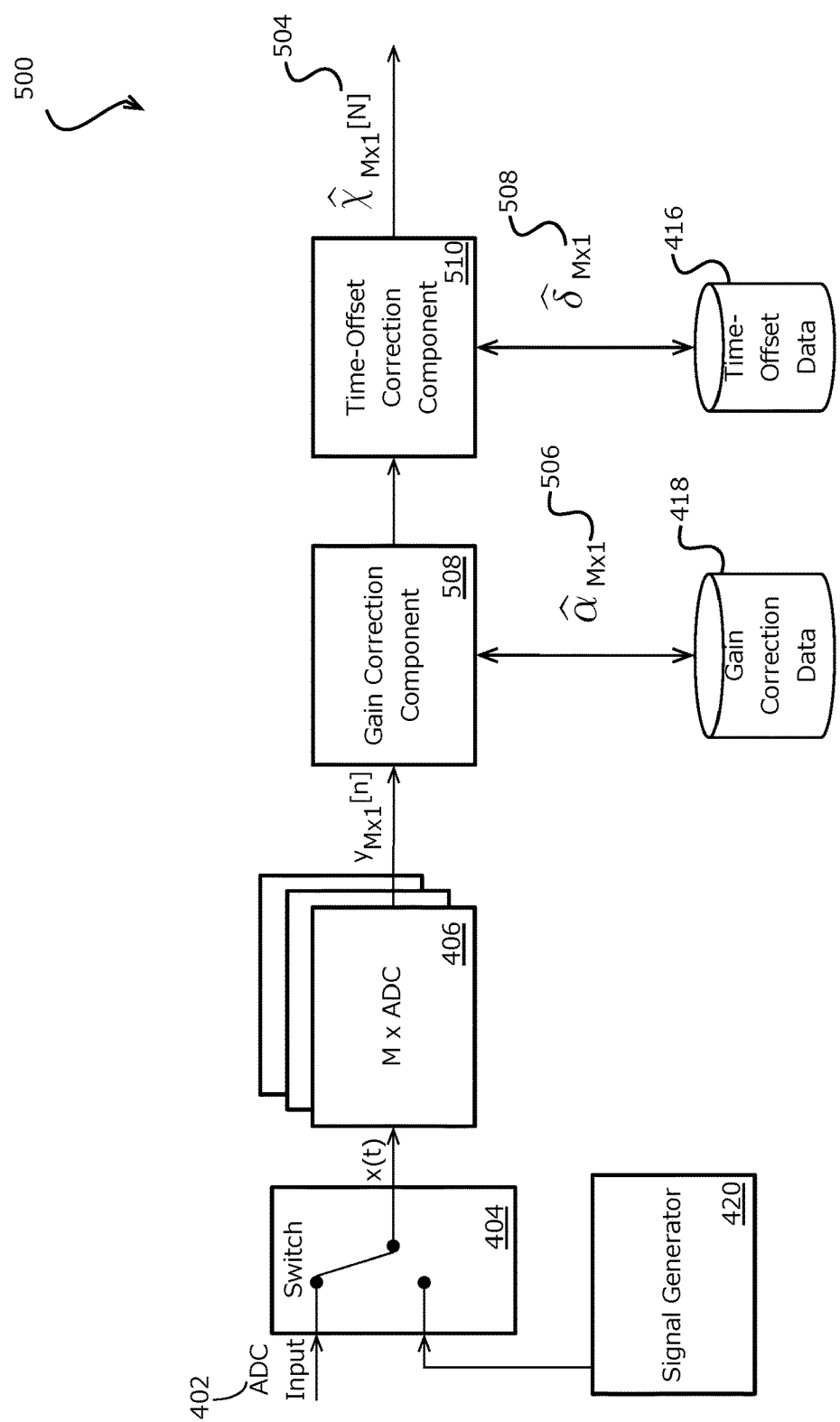
FIG. 5 illustrates a block diagram of a system to calibrate a system of analog-to-digital converters in accordance with various embodiments.

After the calibration phase, the switch is configured in a standard operating mode. For example, the switch is connected to receive ADC input signal 402 as illustrated in example 500 of FIG. 5. In this mode, the time-offset and gain error estimator is disabled or otherwise not in operation and gain correction component 508 and time-offset correction component 510 can use the time-offset calibration data 508 from data store 416 and gain error calibration data 506 from data store 418 to calibrate ADCs 406. For example, ADC input signals with error $Y_{M \times 1}[n]$ are subjected to removal of the estimated time offset and gain error by applying optimized time-offset calibration data from data store 416 which was stored during the calibration phase by time-offset correction component 510 and optimized gain error calibration data from data store 418 which was also stored during the calibration phase by gain correction component 508, resulting in the corrected output signal 504.

Figure 6:
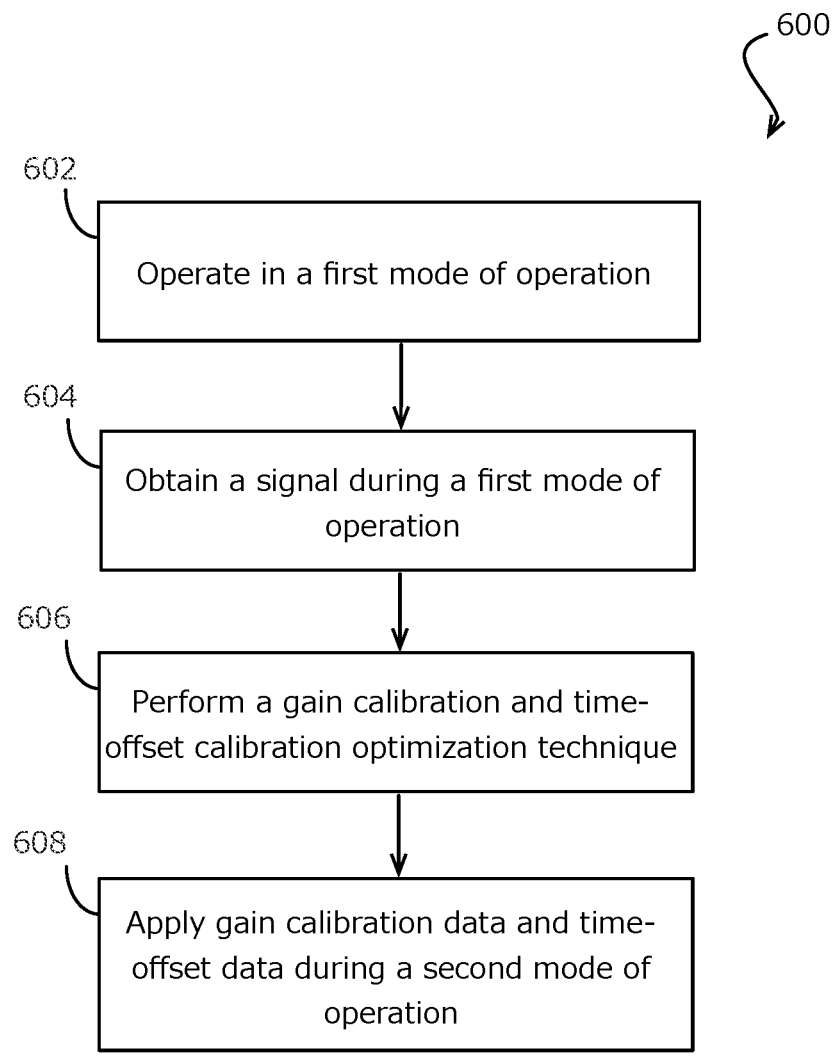
FIG. 6 illustrates an example process for calibrating a system of analog-to-digital converters in accordance with various embodiments.

FIG. 6 illustrates an example process for calibrating a system of analog-to-digital converters in accordance with various embodiments. It should be understood that, for any process described herein, that there can be additional or fewer steps performed in similar or alternative orders, or in parallel, within the scope of the various embodiments unless otherwise stated. In this example, the calibration system operates 602 in a first mode of operation. The first mode of operation can correspond to a calibration operating mode. A signal is obtained 604 at a set of analog-to-digital converters (ADCs) during the first mode of operation. The signal can be a calibration signal and the set of time-interleaved ADCs can be time-interleaved high-speed ADCs. Gain-error estimation and time-offset estimation is performed 606 to determine 608 gain error calibration data and optimized time-offset calibration data. Thereafter, the time-offset calibration data and the gain error calibration data can be used to update output digital signals from a set of time-interleaved ADCs, where the updated digital output signal is calibrated for gain mismatches and timing errors in and between individual ADCs of the set of time-interleaved ADCs.

Figure 7:
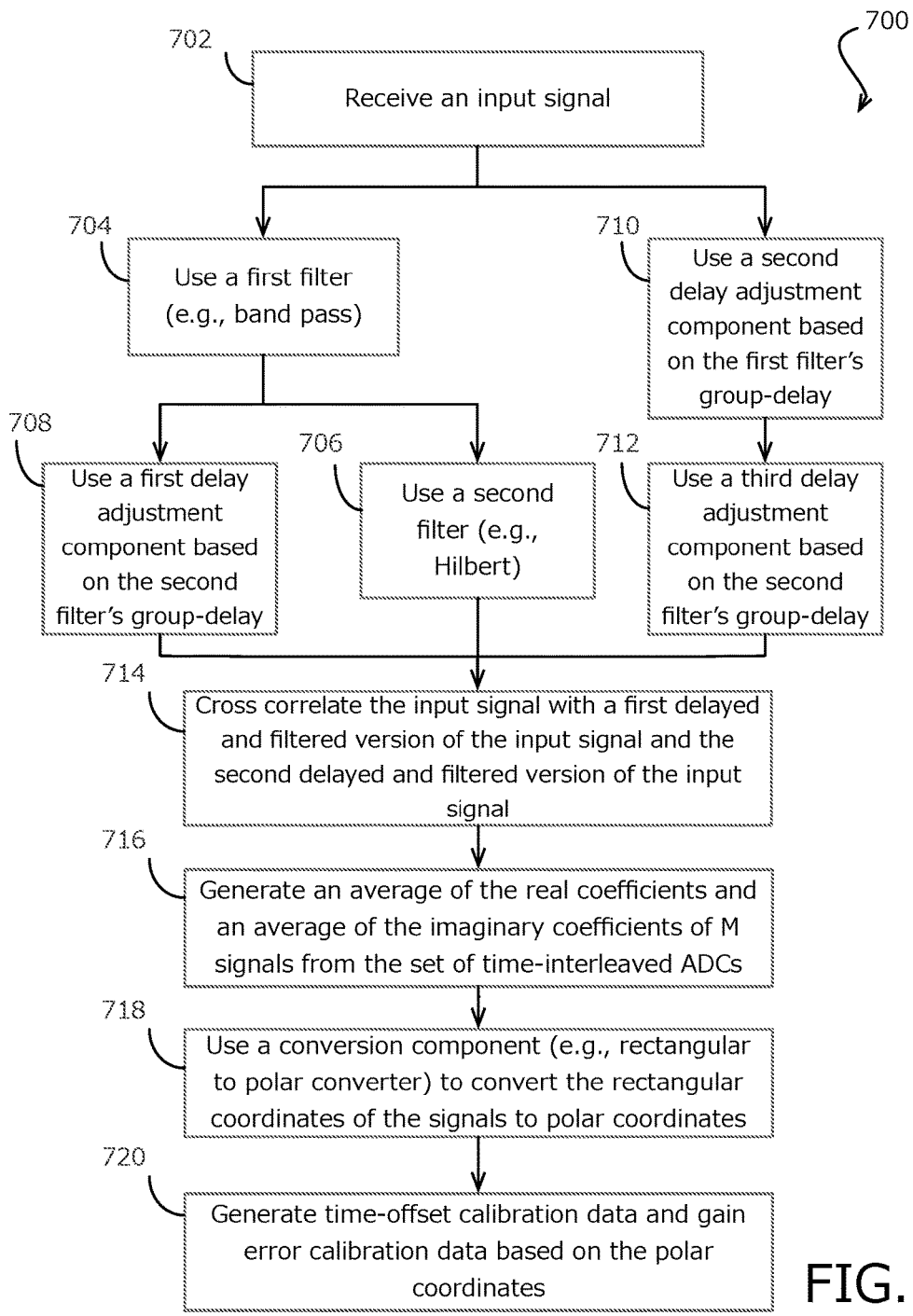
FIG. 7 illustrates an example process for determining gain error calibration data and time-offset calibration data in accordance with various embodiments.

FIG. 7 illustrates an example process 700 for determining gain error calibration data and time-offset calibration data in accordance with various embodiments. In this example, an input signal is received 702. The input signal can include M calibration tones. As described, the M calibration tones can be the input to a set of time-interleaved ADCs. A first filter (e.g., a band pass filter) can be used 704 to filter the input signals to generate output signals that do not include respective images or at least include a reduced number of images. It should be noted that although embodiments may refer to an input signal or an output signal, it will be apparent to those skilled in the art that there can be M input and/or output signals. A second filter (e.g., Hilbert filter) can be used 706 to filter the output signal(s) of the first filter to generate one or more signals that are phase shifted a predetermined amount (e.g., −90 degrees phase shift) and include a sinusoidal signal waveform. A first delay adjustment component based on the second filter's group-delay can be used 708 to delay the output signal(s) of the first filter to generate one or more signals that are delayed a predetermined group delay amount, phase shifted a predetermined amount (e.g., 90 degrees phase shifted), and include a cosine signal waveform.

As the input signals are processed by the first filter, the first delay adjustment component, and the second filter; the input signals can be concurrently processed by using 710 a second delay adjustment component based on the first filter's group delay and using 712 a third delay adjustment component based on the second filter's group-delay. In accordance with various embodiments, the first, second, and third delay adjustment components can provide enough group delay such that the outputs of the first delay adjustment component, the outputs of the second filter, and the outputs of the third delay adjustment component are received at a multiplier module at substantially the same time.

The received signals (e.g., the input signals, sin wave output signals, and cosine wave output signals) are cross correlated 714. For example, the input signal is cross correlated with a first filtered and delayed version of the input signal and a second filtered and delayed version of the input signal. The output(s) of the cross correlated signals are received at an averaging module configured to generate 716 an average of the output signals from the multiplier module. The outputs of the averaging module can include an average of the real coefficients of M signals from the set of time-interleaved ADCs and an average of the imaginary coefficients of M signals from the set of time-interleaved ADCs.

The output signals of the averaging module can be processed using 718 a conversion component (e.g., rectangular to polar converter) to convert the rectangular coordinates of the signals to polar coordinates. Thereafter, time-offset calibration data and gain error calibration data can be generated 720 based on the polar coordinates. For example, a time-offset estimator component can calculate time-offset calibration data, $\delta_m$, by calculating $$\delta_m = \left(\frac{2\pi F_c}{F_s}\right)^{-1} \times \varphi_m,$$

and a gain error estimator component can calculate gain error calibration data, $\alpha_m$, by calculating $$\alpha_m = \frac{r_m}{\frac{1}{M}\Sigma r_m},$$

where $\alpha_m$ is normalized to the average. The time-offset calibration data and the gain error calibration data can be applied 614 the output digital signals from a set of time-interleaved ADCs, where the updated digital output signal is calibrated for gain mismatches and timing errors in and between individual ADCs of the set of time-interleaved ADCs.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to filter tones from a mixed signal using novel integrated circuits in a communications network.

Most embodiments utilize at least one communications network that would be familiar to those skilled in the art for supporting communications using any of a variety of commercially available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random-access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used, and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computing system, comprising:
   a signal generator configured to generate a calibration tone;
   a set of time-interleaved ADCs that include a number of parallel ADCs configured to receive the calibration tone and generate a first signal that includes an image component;
   a set of filtering components,
   a first filtering component configured to filter the image component from the first signal to generate a second signal, and
   a second filtering component configured to shift a phase of the second signal a first predetermined amount of phase shift to generate a third signal;
   a set of delay adjustment components,
   a first delay adjustment component configured to delay the second signal a first amount of time substantially similar to a group delay of the second filtering component to generate a fourth signal,
   a second delay adjustment component configured to delay the first signal a predetermined amount of time substantially similar to a group delay of the first filtering component to generate a fifth signal, and
   a third delay adjustment component configured to delay the fifth signal a predetermined amount of time substantially similar to a group delay of the second filtering component to generate a sixth signal;
   a cross-correlating component configured to cross-correlate the third signal, the fourth signal, and the sixth signal to generate a seventh signal, the seventh signal associated with rectangular coordinates;
   a conversion component configured to generate an eighth signal associated with polar coordinates; and
   a time-offset and gain estimator component configured to determine one of gain error calibration data or time-offset calibration data based at least in part on the eighth signal.

2. The computing system of claim 1, wherein the first filtering component includes a band pass filter and the second filtering component includes a Hilbert filter.

3. The computing system of claim 1, wherein the cross-correlating component includes at least one multiplier component.

4. The computing system of claim 1, further comprising:
   a switch configured to operate in at least one of a first position and a second position, wherein the switch, when operating in the first position, is configured to couple an input source with a set of time-interleaved ADCs, and wherein the switch, when operating in the second position, is configured to couple the signal generator with the set of time-interleaved ADCs.

5. The computing system of claim 1, further comprising:
   a gain correction component configured to apply gain error calibration data; and
   a time-offset correction component configured to apply time-offset calibration data.

6. A computing system, comprising:
   a signal generator configured to generate a calibration tone;
   a set of time-interleaved ADCs that include a number of parallel ADCs configured to receive the calibration tone and generate a signal that includes an image component;
   a set of filtering components configured to at least filter the image component and cause a phase shift in the signal;
   a set of delay adjustment components configured to delay at least the signal a predetermined amount of time;
   a cross-correlating component configured to cross-correlate the signal with an output signal of at least one filtering component of the set of filtering components and an output signal of at least one delay adjustment component of the set of delay adjustment components;
   a conversion component configured to determine polar coordinates from rectangular coordinates; and
   a time-offset and gain estimator component configured to determine one of gain error calibration data or time-offset calibration data based at least in part on an output signal of the conversion component.

7. The computing system of claim 6, wherein the set of filtering components further includes:
   a first filtering component configured to filter the image component from the signal to generate a second signal; and
   a second filtering component configured to shift a phase of the second signal a first predetermined amount of phase shift to generate a third signal.

8. The computing system of claim 7, wherein the set of delay adjustment components further includes:
   a first delay adjustment component configured to delay the second signal a first amount of time substantially similar to a group delay of the second filtering component to generate a fourth a signal;
   a second delay adjustment component configured to delay the signal a predetermined amount of time substantially similar to a group delay of the first filtering component to generate a fifth signal; and
   a third delay adjustment component configured to delay the fifth signal a predetermined amount of time substantially similar to a group delay of the second filtering component to generate a sixth signal.

9. The computing system of claim 8, wherein the cross-correlating component generates a cross-correlated signal, the cross-correlated signal associated with rectangular coordinates.

10. The computing system of claim 9, wherein the conversion component determines polar coordinates based at least in part on the rectangular coordinates.

11. The computing system of claim 10, wherein the time-offset and gain estimator component determines the gain error calibration data and the time-offset calibration data based at least in part on the polar coordinates.

12. The computing system of claim 6, further comprising:
    a gain correction component configured to apply gain error calibration data; and
    a time-offset correction component configured to apply time-offset calibration data.

13. A computer-implemented method, comprising:
    obtaining a signal during a first mode of operation, the signal including an image component;
    filtering the image component from the signal and causing a phase shift of the signal;
    delaying at least the signal a predetermined amount of time;
    cross-correlating the signal with an output signal of at least one filtering component of a set of filtering components and an output signal of at least one delay adjustment component of a set of delay adjustment components to generate a cross-correlated signal;

determining polar coordinates from rectangular coordinates of the cross-correlated signal; and determining one of gain error calibration data or time-offset calibration data based at least in part on the polar coordinates.

14. The computer-implemented method of claim 13, further comprising:

applying the gain error calibration data and the time-offset calibration data.

15. The computer-implemented method of claim 13, further comprising:

enabling a set of filtering components to at least filter the image component and cause a phase shift in the signal.

16. The computer-implemented method of claim 15, further comprising:

enabling a first filtering component to filter the image component from the signal to generate a second signal; and enabling a second filtering component configured to shift a phase of the second signal a first predetermined amount of phase shift to generate a third signal.

17. The computer-implemented method of claim 16, further comprising:

enabling a set of delay adjustment components to delay at least the signal a predetermined amount of time.

18. The computer-implemented method of claim 17, further comprising:

enabling a first delay adjustment component configured to delay the second signal a first amount of time substantially similar to a group delay of the second filtering component to generate a fourth a signal;

enabling a second delay adjustment component configured to delay the signal a predetermined amount of time substantially similar to a group delay of the first filtering component to generate a fifth signal; and enabling a third delay adjustment component configured to delay the fifth signal a predetermined amount of time substantially similar to a group delay of the second filtering component to generate a sixth signal.

19. The computer-implemented method of claim 16, wherein the first filtering component includes a band pass filter and the second filtering component includes a Hilbert filter.

20. The computer-implemented method of claim 13, wherein a cross-correlating component includes a rectangular to polar converter and is operable to determine the cross-correlated signal.

* * * * *